United States Patent
Störzinger et al.

(10) Patent No.: US 9,620,321 B2
(45) Date of Patent: Apr. 11, 2017

(54) FUSE FOR AN ELECTRICAL CIRCUIT AND PRINTED CIRCUIT BOARD HAVING A FUSE

(71) Applicant: BorgWarner Ludwigsburg GmbH, Ludwigsburg (DE)

(72) Inventors: Michael Störzinger, Bretten (DE); Bernd Halbrock, Königsbach-Stein (DE); Sisay Tadele, Leonberg (DE); Norbert Ernst, Billigheim-Ingenheim (DE)

(73) Assignee: BorgWarner Ludwigsburg GmbH, Ludwigsburg (DE)

(*) Notice: Subject to any disclaimer, the term of this patent is extended or adjusted under 35 U.S.C. 154(b) by 0 days.

(21) Appl. No.: 14/824,474

(22) Filed: Aug. 12, 2015

(65) Prior Publication Data

US 2016/0049275 A1  Feb. 18, 2016

(30) Foreign Application Priority Data

Aug. 18, 2014  (DE) .................. 10 2014 111 772

(51) Int. Cl.
*H01H 85/36* (2006.01)
*H01H 85/20* (2006.01)
(Continued)

(52) U.S. Cl.
CPC .......... *H01H 85/36* (2013.01); *H01H 37/761* (2013.01); *H01H 85/055* (2013.01);
(Continued)

(58) Field of Classification Search
CPC ...... H01H 37/761; H01H 85/20; H01H 85/36; H01H 85/055; H01H 2037/046; H01H 2037/763; H01H 2085/0275
(Continued)

(56) References Cited

U.S. PATENT DOCUMENTS 530,430 A * 12/1894 Klein ..................... H01H 37/76
                                                    337/403
2,790,049 A * 4/1957 McAlister ............ H01H 37/761
                                                    337/405
(Continued)

FOREIGN PATENT DOCUMENTS

DE            7520602    * 10/1975  ............. H01H 37/76
DE  10 2011 118 724 A1   5/2013
GB          1419528 A    * 12/1975  ............. F02P 19/00

*Primary Examiner* — Anatoly Vortman
(74) *Attorney, Agent, or Firm* — Bose McKinney & Evans LLP

(57) ABSTRACT

Described is a fuse for an electrical circuit, comprising two contact arms, each having at least one connecting pin for inserting into a hole of a printed circuit board, and a spring which connects the two contact arms in an electrically conductive manner. According to this disclosure, it is provided that the spring is fastened to at least one of the two contact arms by means of a fastening means that loses its strength at a trigger temperature of the fuse, wherein the fuse is formed in such a manner that by inserting the connecting pins into holes of a printed circuit board, the spring is loaded such that the spring lifts from the at least one contact arm by spring force as soon as the fastening means loses its strength due to overheating. Moreover, a printed circuit board comprising such a fuse is described.

11 Claims, 4 Drawing Sheets

(51) Int. Cl.
*H01H 85/055* (2006.01)
*H01H 37/76* (2006.01)
*H01H 85/02* (2006.01)
*H01H 37/04* (2006.01)

(52) U.S. Cl.
CPC ....... *H01H 85/20* (2013.01); *H01H 2037/046* (2013.01); *H01H 2037/763* (2013.01); *H01H 2085/0275* (2013.01)

(58) Field of Classification Search
USPC ...................................................... 337/186
See application file for complete search history.

(56) References Cited

U.S. PATENT DOCUMENTS

| | | | | | |
|---|---|---|---|---|---|
| 2,921,167 | A * | 1/1960 | Dahlen | ................ | H01H 85/36 337/181 |
| 3,198,914 | A * | 8/1965 | Baran | ................ | H01H 85/36 337/405 |
| 3,613,040 | A * | 10/1971 | Fluder | ................ | H01H 9/443 218/24 |
| 3,629,766 | A * | 12/1971 | Gould, Jr. | ................ | H01H 71/20 337/239 |
| 3,638,083 | A * | 1/1972 | Dornfeld | ................ | H01G 2/14 337/297 |
| 3,639,874 | A * | 2/1972 | Deelman | ................ | H01H 85/36 337/185 |
| 3,763,454 | A * | 10/1973 | Zandonatti | ........... | H01H 37/761 337/404 |
| 3,913,049 | A * | 10/1975 | Burch | ................ | H01H 73/22 337/112 |
| 3,913,052 | A * | 10/1975 | Hickling | ................ | H01H 71/16 337/346 |
| 4,047,143 | A * | 9/1977 | Burden | ................ | H01H 85/36 337/239 |
| 4,486,804 | A * | 12/1984 | Watson | ................ | H01H 85/048 337/239 |
| 4,496,929 | A * | 1/1985 | Urani | ................ | H01H 85/306 337/261 |
| 4,550,962 | A * | 11/1985 | Czeschka | ........... | H01R 12/585 29/739 |
| 4,661,881 | A * | 4/1987 | Watson et al. | ....... | H01H 85/048 337/239 |
| 5,153,805 | A * | 10/1992 | Tennant et al. | ........ | H02H 5/042 361/106 |
| 5,192,937 | A * | 3/1993 | Lee | ................ | H01C 1/00 337/104 |
| 5,276,422 | A * | 1/1994 | Ikeda | ................ | H01H 77/04 337/16 |
| 5,280,262 | A * | 1/1994 | Fischer | ................ | H01H 37/761 337/402 |
| 5,600,295 | A * | 2/1997 | Kaufmann | ........... | H01H 37/761 337/402 |
| 5,612,662 | A * | 3/1997 | Drekmeier | ........... | H01H 37/761 29/623 |
| 5,770,993 | A * | 6/1998 | Miyazawa | ............... | H01C 7/13 337/142 |
| 5,793,274 | A * | 8/1998 | Kelly | ..................... | H01H 85/36 337/141 |
| 5,831,507 | A * | 11/1998 | Kasamatsu | ............... | H01H 9/10 337/299 |
| 5,896,080 | A * | 4/1999 | Chen | .................... | H01H 37/761 337/401 |
| 5,933,310 | A * | 8/1999 | Eggendorfer | .......... | H02H 9/042 337/76 |
| 5,941,735 | A * | 8/1999 | Bernardini | ............. | H01H 85/20 439/698 |
| 5,982,270 | A * | 11/1999 | Wolfe, Jr. | .............. | H01H 37/76 337/165 |
| 5,999,391 | A * | 12/1999 | Lou | ........................ | H02H 9/042 361/103 |
| 6,088,234 | A * | 7/2000 | Ishikawa | ............... | H01H 37/761 174/260 |
| 6,380,837 | B1 * | 4/2002 | Lindquist | ............... | H01H 85/12 337/163 |
| 6,636,409 | B2 * | 10/2003 | Kladar | ..................... | H01C 7/12 361/104 |
| 6,741,159 | B1 * | 5/2004 | Kuczynski | ........... | H01H 37/002 337/142 |
| 7,002,785 | B1 * | 2/2006 | Bothe | ..................... | H01H 37/76 361/103 |
| 7,023,674 | B2 * | 4/2006 | Gross | .................. | H01H 37/761 337/407 |
| 7,639,114 | B2 * | 12/2009 | Yu | ......................... | H01H 37/761 29/623 |
| 7,864,024 | B2 * | 1/2011 | Schlenker | ............ | H01H 37/761 337/239 |
| 8,154,377 | B2 * | 4/2012 | Lietz | ..................... | H01H 85/08 200/50.07 |
| 8,665,057 | B2 * | 3/2014 | Schlenker | ............ | H01H 37/761 337/239 |
| 8,749,940 | B2 * | 6/2014 | Schmidtlein | ......... | H01H 37/761 361/103 |
| 8,816,390 | B2 * | 8/2014 | Marbella | ........... | H01L 23/49562 257/173 |
| 9,083,174 | B2 * | 7/2015 | Meyer | ..................... | H02H 5/04 |
| 2004/0005795 | A1 * | 1/2004 | Wu | ........................ | H01R 13/41 439/81 |
| 2005/0181651 | A1 * | 8/2005 | Matsumura | .......... | H01R 12/585 439/259 |
| 2014/0113504 | A1 * | 4/2014 | Moser | ..................... | H01R 13/03 439/751 |

* cited by examiner

FUSE FOR AN ELECTRICAL CIRCUIT AND PRINTED CIRCUIT BOARD HAVING A FUSE

RELATED APPLICATIONS

This application claims priority to DE 10 2014 111 772.7, filed Aug. 18, 2014, the entire disclosure of which is hereby incorporated herein by reference in its entirety.

BACKGROUND

The invention relates to a fuse for an electrical circuit. Known from DE 10 2011 118 724 A1 is a fuse that consists of a leaf spring, each of the two ends of which is inserted in a hole of a printed circuit board and is soldered therein. A middle portion of the leaf spring is welded to a projection of a heat sink. The leaf spring is under mechanical tension. If the solder joints are heated above the melting point thereof, the mechanical tension of the leaf spring causes the ends thereof to be pulled out of the printed circuit board and thus the circuit to be interrupted.

SUMMARY

This disclosure teaches how a thermal fuse can be mounted on a printed circuit board in a simpler manner.

A fuse according to this disclosure comprises two contact arms, each of which has at least one connecting pin configured for inserting into a hole of a printed circuit board, and a spring which connects the two contact arms in an electrically conductive manner. This spring is fastened to one of the two contact arms by means of a fastening means which loses its strength upon reaching a trigger temperature of the fuse. The fastening means can be solder, for example. The fuse is formed such that by inserting the connecting pins into holes of a printed circuit board, the spring is tensioned in such a manner that a restoring force of the spring causes it to disconnect the spring from at least one of the contact arms as soon as the fastening means loses its strength due to overheating.

When the connecting pins of the fuse are inserted in the holes of a printed circuit board, the fastening means thus is loaded by a preload of the spring. As soon as the fastening means is heated beyond the trigger temperature, it loses its strength (fails) and can no longer withstand the preload of the spring. Then, the leaf spring disconnects from one of the two contact arms of the fuse and thereby interrupts the current flowing through the fuse.

The fuse can be mounted on a printed circuit board with advantageously little effort. The fuse can be mounted on a printed circuit board together with other circuit elements as part of an automated printed circuit board assembly. It is sufficient to insert the connecting pins of the fuse into holes of the printed circuit board. Moreover, the fuse can respond very rapidly and reliably.

It is possible to fasten the spring to both contact arms in the same manner using a fastener or fastening means that loses its strength at a critical temperature, for example to solder the spring to both contact arms. However, it is then not predefined from which of the two contact arms the spring detaches first. Preferably, the spring is fastened only to one of the two contact arms by the fastening means so that the spring then can detach from this contact arm. For example, the spring can be welded to the other contact arm, can be formed integrally with the same or can be soldered thereto by means of solder material that has a melting point higher than the trigger temperature of the fuse. If the spring is soldered to both contact arms, it is thus preferred to use different solder materials with different melting points for the two contact arms. The lower melting point then determines the trigger temperature of the fuse.

The spring preferably is a metal strip, for example a leaf spring. The metal strip can be bent to a greater or lesser extent. When inserting the connecting pins into holes of the printed circuit board, the metal strip can be brought from a non-bent into a bent shape or can be brought from a bent into a non-bent shape. Generally speaking, the bending state of the metal strip is changed when inserting the connecting pins into holes of a printed circuit board. The spring can also be a leg spring, for example.

An advantageous refinement of this disclosure provides that the connecting pins are configured as press-in pins for a solder-free electrical connection to a printed circuit board, for example in that a middle portion of the connecting pin is bulged. For mounting the fuse on a printed circuit board it is then sufficient to press the connecting pins into holes of a printed circuit board. Pre-damage to the fastening means, for example a solder joint between the spring and the contact arm or contact arms, can thus be excluded.

Another advantageous refinement of this disclosure provides that each of the two contact arms of the fuse has a plurality of connecting pins. In this manner, thermal coupling of the fuse to the printed circuit board and current carrying capacity can be improved.

BRIEF DESCRIPTION OF THE DRAWINGS

The above-mentioned aspects of exemplary embodiments will become more apparent and will be better understood by reference to the following description of the embodiments taken in conjunction with the accompanying drawings, wherein:

FIG. 1c shows a sectional view of a connecting pin of the fuse according to the section line of FIG. 1a;
FIG. 1d shows another view of the fuse.

DESCRIPTION

The embodiments described below are not intended to be exhaustive or to limit the invention to the precise forms disclosed in the following detailed description. Rather, the embodiments are chosen and described so that others skilled in the art may appreciate and understand the principles and practices of this disclosure.

Figure 1:
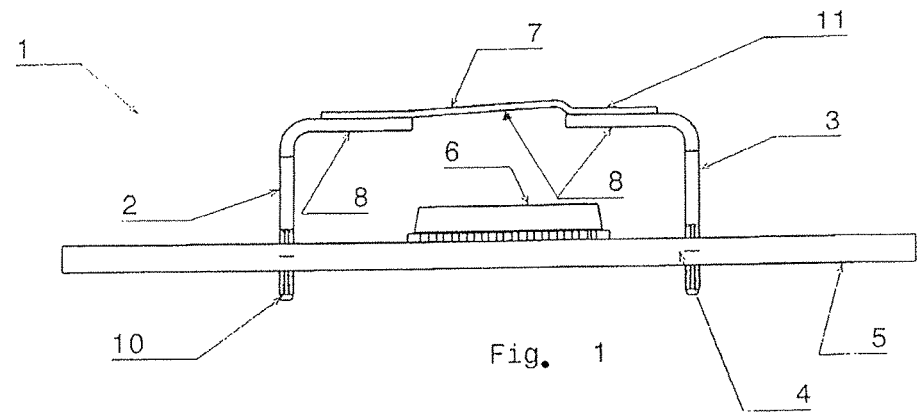
FIG. 1 shows a printed circuit board with a fuse and a circuit element.

Illustrated in FIG. 1 is a system comprising of a printed circuit board 5 and a thermal fuse 1 which protects a circuit component 6, for example a power semiconductor device, arranged on the printed circuit board 5 against overheating. The fuse 1 comprises a first contact arm 2 with connecting pins 10, a second contact arm 3 with connecting pins 10 and a spring 7 which is fastened to both contact arms 2, 3 and connects them in an electrically conductive manner. The connecting pins 10 are inserted in holes of the printed circuit board 5 and effect an electrical contact 4.

Figures 1A, 1B:
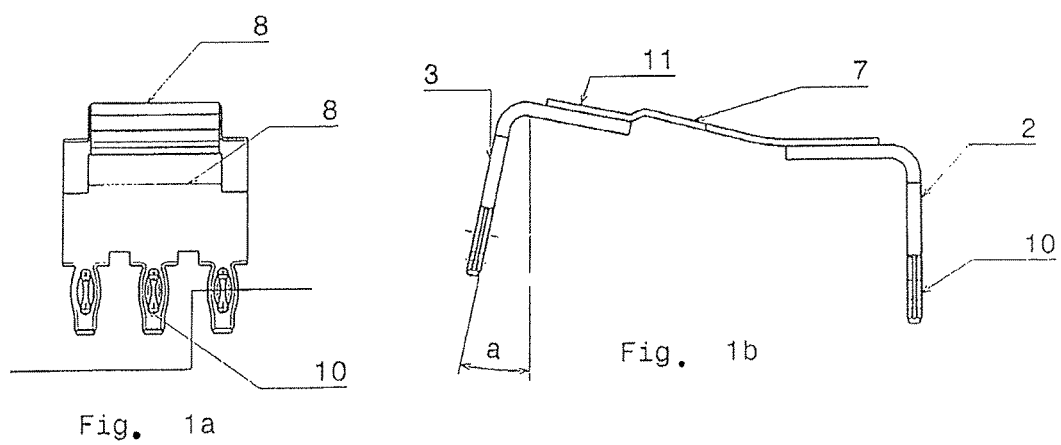
FIG. 1a shows a side view of the fuse.
FIG. 1b shows another view of the fuse.

As shown in FIG. 1*b*, the connecting pins 10 of the first contact arm 2 and the connecting pins 10 of the second contact arm 3 are arranged at an acute angle relative to one another. This angle a is indicated in FIG. 1*b*. When the connecting pins 10 are inserted in vertical holes of a flat printed circuit board 5, the connecting pins 10 are parallel to one another and the spring 7 is under mechanical tension. This mechanical tension is absorbed by a fastening means, e.g., solder material, that connects the spring 7 to the contact arm 3. The corresponding solder joint 11 is indicated in the FIGS. 1, 1*b* and 1*d*. If the fuse is overheated, the solder material becomes liquid so that the spring 7 disconnects at least from the contact arm 3 due to the mechanical tension and thus interrupts a current flow. Thus, the trigger temperature of the fuse is determined by the melting point of the solder joint 11.

The spring 7 can be soldered to the two contact arms 2, 3. To ensure that the spring 7, which, for example, can be a metal strip or a coil spring, does not lift from the contact arms 2, 3 in an undefined manner, the spring 7 can be welded to the first contact arm 2 and soldered to the second contact arm 3. It is also possible that the spring 7 is connected to the first contact arm 2 using a first solder material and is connected to the second contact arm 3 using a different fastening means, for example a second solder material with a lower melting temperature. In this manner it can also be ensured that upon exceeding a trigger temperature, the spring 7 always detaches only from the second contact arm 3 and remains fastened to the first contact arm 2.

Figures 1C, 1D:
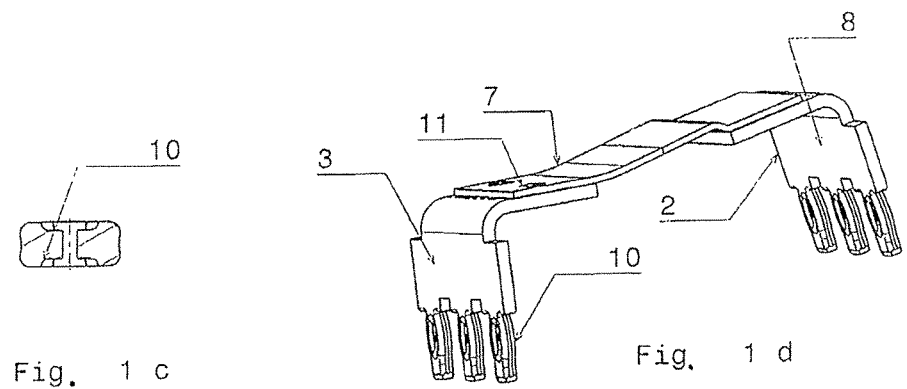

The connecting pins 10 can be formed as press-in pins. Press-in pins have the advantage that soldering connecting pins in holes of a printed circuit board is eliminated. By pressing press-in pins into holes of a printed circuit board, reliable electrical contacting can be implemented. The press-in pins have a bulge at a middle portion, which bulge can be formed as increased width or thickness of the pin and provides for a tight fit in the hole of the printed circuit board. In this bulged middle portion, press-in pins can have an eye, which is shown in FIG. 1*c*. The eye effects that the bulged middle portion can be pressed together more easily when inserting the connecting pin into the hole of printed circuit board. However, press-in pins can also be solid.

The spring 7 can be formed as a metal strip. The spring 7 can be a leaf spring, for example. The magnitude of the preload of the spring 7 when the fuse is mounted on a printed circuit board 4 can be set through the thickness, width and bending as well as the material of the metal strip.

A metal strip advantageously provides an area 8 via which the fuse 1 can absorb heat radiated from a circuit component 6. Thermal coupling of the fuse 1 to the circuit component 6 to be protected, for example a processor or field-effect transistor, can be optimized through size and position of the heat-absorbing surface 8. Additional heat-absorbing areas 8 are formed by the two contact arms 2, 3 of the fuse. The surface of the heat-absorbing areas can be treated, for example roughened or coated, for increasing the absorption of thermal radiation. A coating for increasing the absorption of thermal radiation can be, e.g., a lacquer, preferably a black lacquer.

Figure 2:
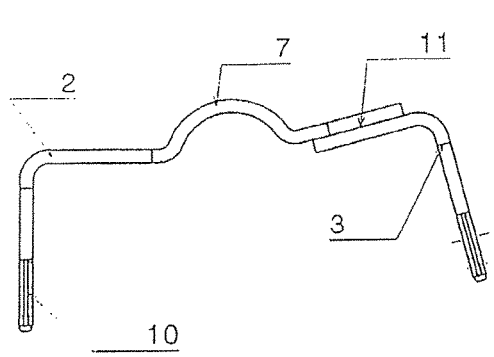
FIG. 2 shows another embodiment of a fuse.
Figure 2A:
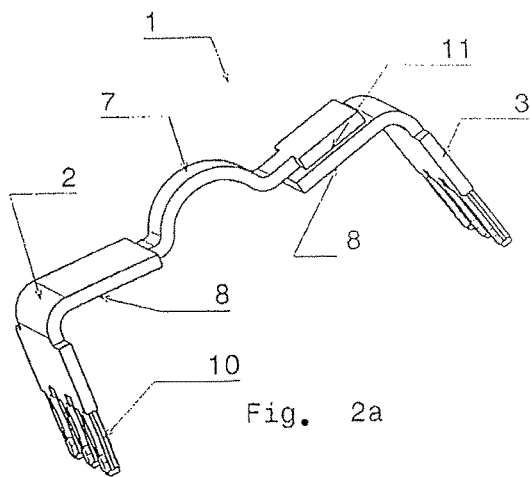
FIG. 2a shows another view of the fuse shown in FIG. 2.
Figure 3:
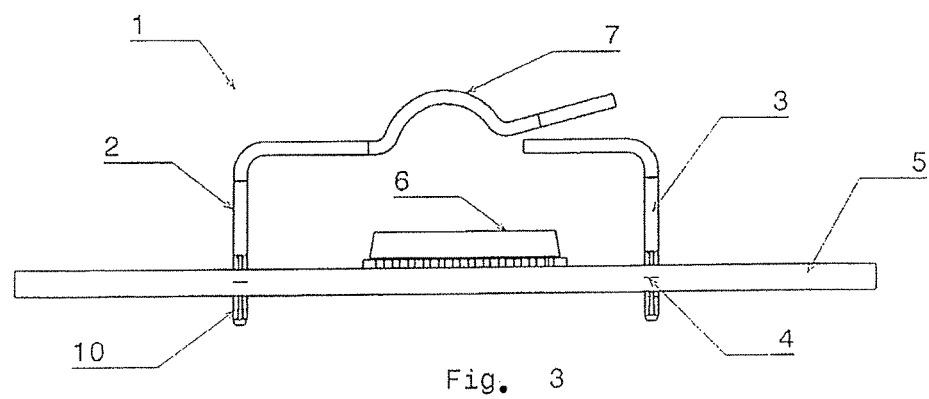
FIG. 3 shows the fuse shown in FIG. 2 in the triggered state with a printed circuit board.
Figure 3A:
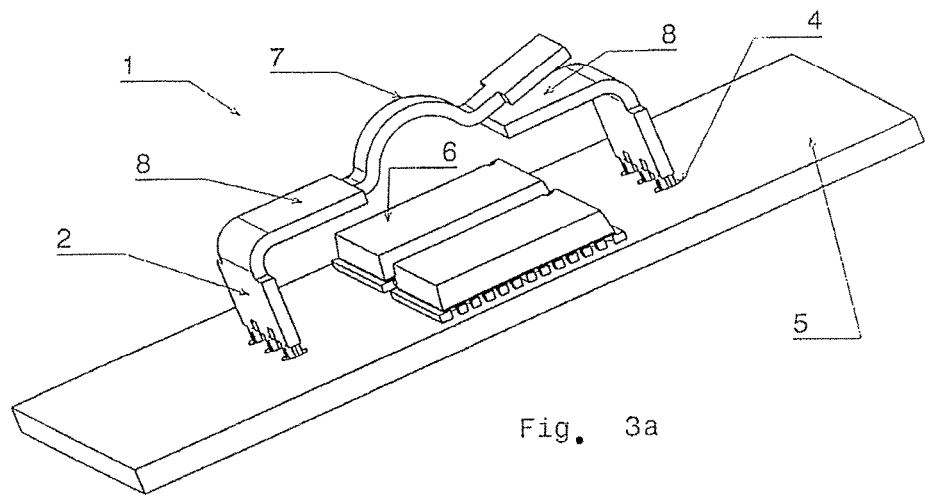
FIG. 3a shows another view of FIG. 3.

FIGS. 2 and 2*a* illustrate a second embodiment of a fuse 1. FIGS. 3 and 3*a* show printed circuit boards 5 including this fuse 1. The second embodiment differs from the first embodiment in that the first contact arm 2 is formed integrally, i.e., as one piece, with the spring 7. The second contact arm 3 is soldered to the spring 7.

Figure 4:
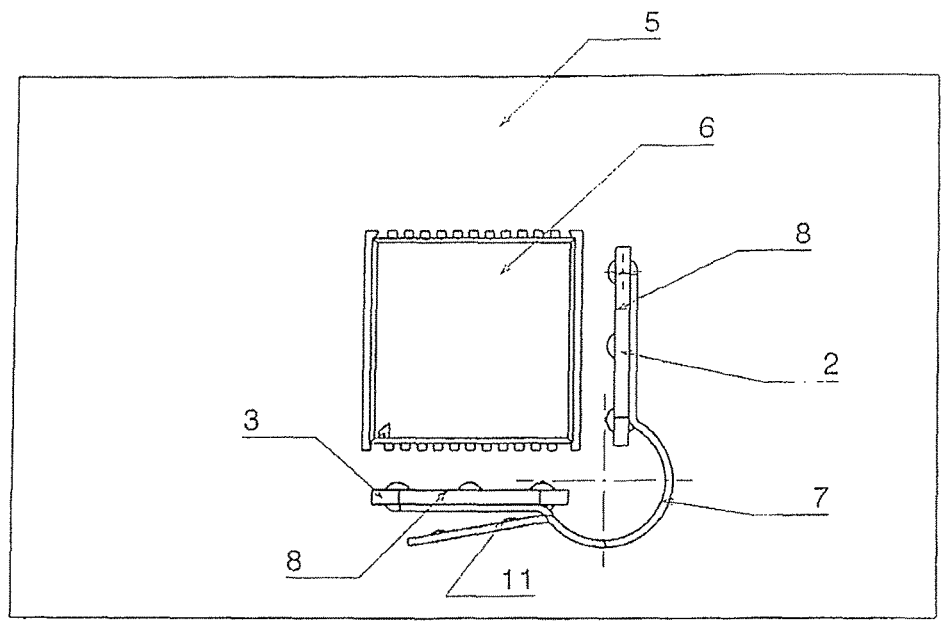
FIG. 4 shows a printed circuit board with a circuit element and another embodiment of a fuse.
Figure 4A:
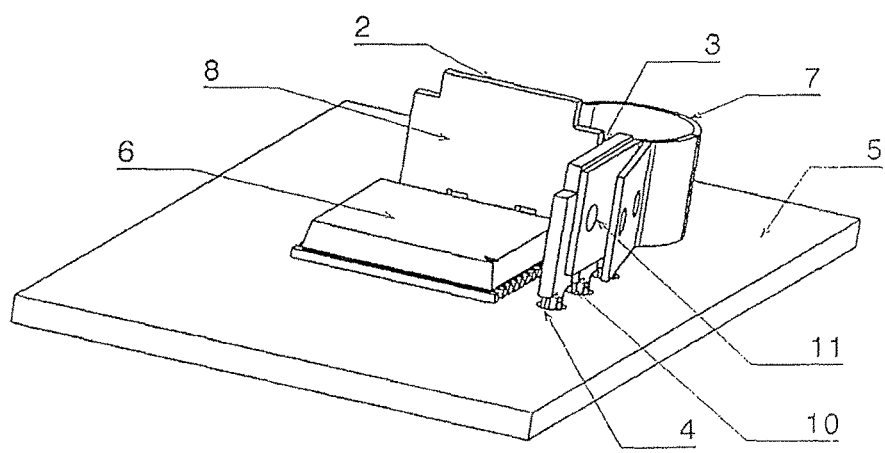
FIG. 4a shows another view of FIG. 4.
Figure 5:
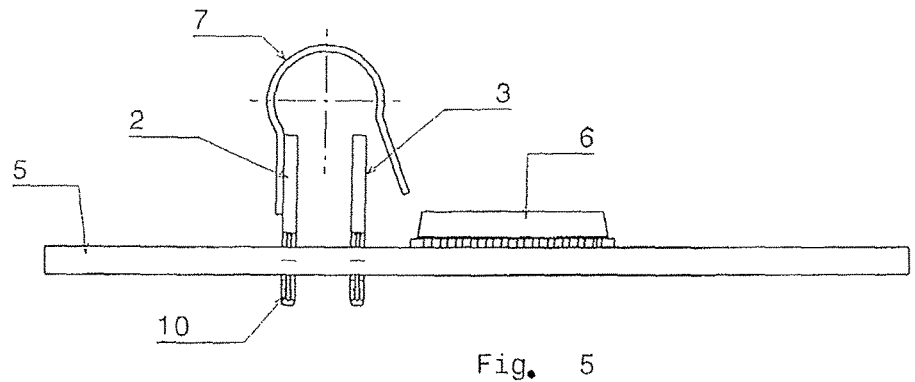
FIG. 5 shows a printed circuit board with a circuit element and another embodiment of a fuse.

FIGS. 4 and 5 show a third embodiment of a fuse 1 together with a printed circuit board 5 in the holes 10 of which the connecting pins 10 of the fuse 1 are inserted. The essential difference to the first embodiment is the orientation of the fuse 1 relative to the printed circuit board 5. In the first and also the second embodiment, the fuse 1 resembles a bridge. The spring 7 of the first and second embodiments can therefore be arranged above a circuit component 6. The connecting pins 10 extend in the longitudinal direction of the contact arms 2, 3. However, in the third embodiment, the fuse 1 is formed like a wall arranged laterally next to a circuit component 6. This different orientation of the fuses 1 is shown in the orientation of the connecting pins 10 of the two contact arms 2, 3. In the third embodiment, the connecting pins 10 are arranged perpendicular to the longitudinal direction of the contact arms 2, 3. The insertion pins 10 are already parallel to one another prior to the insertion into the holes of a printed circuit board 5. In contrast to this, the connecting pins 10 of the first contact arm 2 are arranged at an acute angle relative to the connecting pins 10 of the second contact arm 3.

Figure 5A:
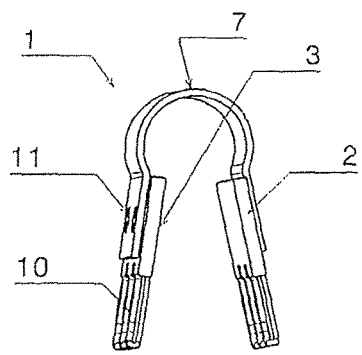
FIG. 5a shows a view of the fuse shown in FIG. 5.

FIG. 5 shows a fourth embodiment of a fuse 1 in the triggered state together with a printed circuit board 5. FIG. 5*a* shows this fuse 1 in the state as fabricated prior to the mounting on a printed circuit board. The fourth embodiment substantially differs from the first embodiment only in the fact that the metal strip forming the spring 7 is significantly more bent.

Figure 6:
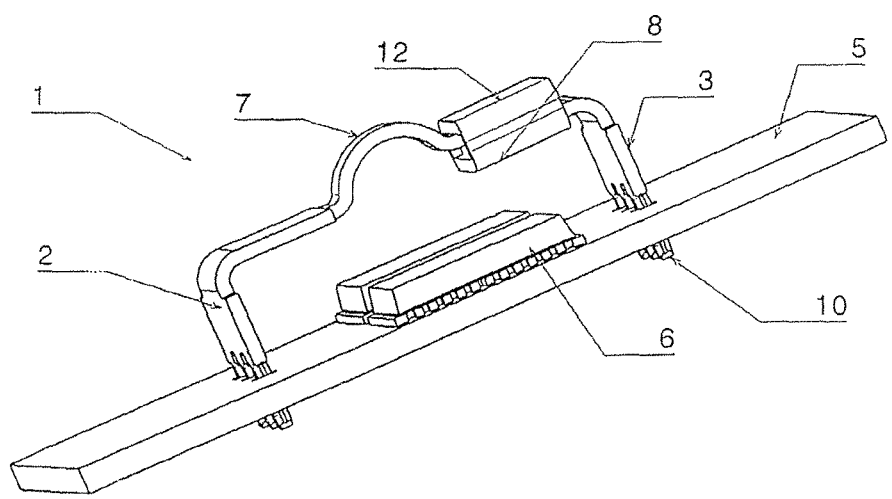
FIG. 6 shows a printed circuit board with a circuit element and a further embodiment of a fuse.

FIG. 6 shows a fifth embodiment of a fuse 1 together with a printed circuit board 5 and a circuit component 6 protected in this manner against overheating. In this embodiment, the fastening means which fastens the spring 7 to the second contact arm 3 and which loses its strength when overheating is not a solder material, but instead a plastic element 12. The plastic element 12, for example, can be composed of a thermoplastic resin which becomes soft upon overheating to an extent that the spring 7, due to its mechanical pretension, can lift from the contact arm 3. In this embodiment, the trigger temperature of the fuse 1 thus is predetermined by the temperature at which the plastic element 12 softens to such an extent that the strength thereof is no longer sufficient to press the spring 7 against the mechanical pretension against the contact arm 3. The plastic element 12 can be produced by injection molding around the contact arm 3 and the spring 7 or can be slid on as a separate component.

While exemplary embodiments have been disclosed hereinabove, the present invention is not limited to the disclosed embodiments. Instead, this application is intended to cover any variations, uses, or adaptations of this disclosure using its general principles. Further, this application is intended to cover such departures from the present disclosure as come within known or customary practice in the art to which this invention pertains and which fall within the limits of the appended claims.

What is claimed is:

1. A fuse for an electrical circuit, comprising:
   two contact arms, each having at least one connecting pin configured for inserting into a respective hole of a printed circuit board;
   a spring which connects the two contact arms in an electrically conductive manner;

wherein the spring is fastened to at least one of the two contact arms by a fastening means comprising a soldered joint that loses its strength at a trigger temperature of the fuse;

whereby inserting the connecting pins into holes of a printed circuit board loads the spring such that the spring disconnects from at least one of the contact arms by spring force as soon as the fastening means fails due to overheating; and wherein the spring and the at least one of the two contact arms are both flat metal strips which define planar contact areas, the planar contact areas being engaged together and secured by the soldered joint and wherein one of the flat metal strips defines a planar heat absorbing area opposite the planar contact areas.

2. The fuse according to claim 1, wherein the planar heat absorbing area has a coating for increasing the absorption of thermal radiation.

3. The fuse according to claim 1, wherein the spring is fastened by means of the fastening means which loses its strength at the trigger temperature of the fuse only to one of the two contact arms.

4. The fuse according to claim 1, wherein a plurality of connecting pins is arranged on each of the two contact arms.

5. The fuse according to claim 1, wherein the connecting pins are formed as press-in pins for a solder-free connection to a printed circuit board.

6. The fuse according to claim 5, wherein the connecting pins have a bulge at a middle portion thereof.

7. The fuse according to claim 1, wherein the at least one connecting pin of one of the contact arms is arranged at an acute angle relative to the at least one connecting pin of the other contact arm.

8. The fuse according to claim 1, wherein the at least one connecting pin of one of contact arms is parallel to the at least one connecting pin of the other contact arm.

9. The fuse of claim 1 further comprising a surface treatment on the planar heat absorbing area.

10. A printed circuit board comprising a fuse that has two contact arms each with at least one connecting pin inserted in a respective hole of the printed circuit board, wherein the two contact arms are connected by a spring in an electrically conductive manner, wherein:

the spring is fastened by means of a fastening means comprising a soldered joint that loses its strength when overheating to at least one of the two contact arms, and the spring applies a preload to the fastening means so that the spring lifts from the at least one of the two contact arms as soon as the fastening means loses its strength due to overheating; and wherein the spring and the at least one of the two contact arms are both flat metal strips which define planar contact areas, the planar contact areas being engaged together and secured by the soldered joint and wherein one of the flat metal strips defines a planar heat absorbing area opposite the planar contact areas.

11. The printed circuit board of claim 10 further comprising a surface treatment on the planar heat absorbing area.

* * * * *